(12) United States Patent
Saitou et al.

(10) Patent No.: US 6,323,526 B1
(45) Date of Patent: Nov. 27, 2001

(54) SEMICONDUCTOR INTEGRATED CIRCUIT

(75) Inventors: Seiiti Saitou; Katuyuki Yasukouchi; Hiroko Kinoshita; Shinichi Nakagawa, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/332,026

(22) Filed: Jun. 14, 1999

(30) Foreign Application Priority Data

Jul. 30, 1998 (JP) .................................................. 10-214970

(51) Int. Cl.[7] .................................................. H01L 29/76
(52) U.S. Cl. .................................................. 257/401; 257/343
(58) Field of Search .................................................. 257/401, 341, 257/343

(56) References Cited

U.S. PATENT DOCUMENTS 5,986,292 * 11/1999 Mizuno et al. .................... 257/401

* cited by examiner

*Primary Examiner*—Sara Crane
(74) *Attorney, Agent, or Firm*—Armstrong, Westerman, Hattori, McLeland & Naughton, LLP.

(57) ABSTRACT

A semiconductor integrated circuit includes four electrodes arranged in a matrix and a wire connecting between two electrodes which are diagonally positioned to each other and selected from the four electrodes. The two remaining electrodes are diagonally positioned to each other across the wire, and have a side thereof facing the wire and extending in parallel to a longitudinal direction of the wire.

9 Claims, 6 Drawing Sheets

SEMICONDUCTOR INTEGRATED CIRCUIT

BACKGROUND OF THE INVENTION

1. Field of the Invention

The present invention generally relates to output parts of a semiconductor integrated circuit such as a power switch IC used for power-control/power-saving-control purposes, and particularly relates to a pattern shape of a set of MOSFET devices which particularly require a high-density implementation.

2. Description of the Related Art

Output parts of power switch ICs need to possess great driving power, and, thus, is comprised of a large number of MOSFET devices.

FIG. 2 is an illustrative drawing showing a configuration of output parts of a related-art power switch IC.

As shown in FIG. 2, MOSFET devices are arranged in a matrix formation at high density within a limited space. Source regions are connected via wires between different devices, and so are drain regions, thereby forming a large single transistor device.

FIG. 3 is an illustrative drawing showing an enlarged view of MOSFET devices which are arranged as the output parts of the related-art power switch IC.

In FIG. 3, source electrodes 14 and 15 cover source regions of MOSFET devices, which exist beneath the source electrodes 14 and 15. Likewise, drain electrodes 16 and 17 cover drain regions of the MOSFET devices, which underlay the drain electrodes 16 and 17. These electrodes are formed from an aluminum layer. A wire 18 diagonally connect adjacent drain electrodes 16 and 17, and is formed from the same aluminum layer. Contact holes 19 and 20 connect between the source electrodes 14 and 15 and the underlaying source regions, respectively. Contact holes 21 and 22 connect between the drain electrodes 16 and 17 and the underlaying drain regions, respectively.

The wire 18 is diagonally laid out in order to help to shorten a distance between MOSFET devices, thereby achieving a high packing density of the MOSFET devices. The extent to which the MOSFET devices are packed in a compact space will determine the overall area size of the output parts. The higher the packing density, the smaller the area size of the power switch IC is.

In a MOSFET pattern, however, there is a limit to how short a tolerable distance can be between regions. A minimum tolerable distance is governed by such factors as limits of lithography or etching processes as well as distances necessary to insure electrical insulation.

With reference to FIG. 3, a description will be given below with regard to distances between regions of MOSFET devices and associated problems.

In FIG. 3, a distance between a perimeter of the contact holes 19 and 20 and source electrodes 14 and 15, respectively, is denoted as 24. This distance 24 must be longer than such a minimum tolerable distance as a margin of error for relative positioning requires. A distance 25 is the shortest distance between the wire 18 and either one of the source electrodes 14 and 15. Since the wire 18 and the source electrodes 14 and 15 are formed in the same layer, the distance 25 must be longer than such a minimum tolerable distance as electrical insulation can be secured. A distance 26 between the source electrodes 14 and 15 and the drain electrodes 16 and 17 represents a distance between the MOSFET devices arranged in a matrix.

In the related-art configuration of the MOSFET devices as shown in FIG. 3, if the distance 26 between the MOSFET devices is shortened, the rectangular source electrodes 14 and 15 may have corners thereof approaching too close to the wire 18, so that the distance 25 may become shorter than the minimum tolerable distance. In order to keep this minimum tolerable distance, intervals at which the MOSFET devices are arranged cannot be shortened than certain limits. There is a limit, therefore, to a reduction in a device size as long as the related-art configuration of MOSFET devices is used. It should be noted that the same argument applies to a distance between the drain electrodes 16 and 17 and a diagonally installed wire (not shown) connecting source regions together.

Accordingly, there is a need for a semiconductor integrated circuit which allows MOSFET devices forming output parts thereof to be densely arranged, thereby reducing an overall size of the output parts.

SUMMARY OF THE INVENTION

Accordingly, it is a general object of the present invention to provide a semiconductor integrated circuit which can satisfy the need described above.

It is another and more specific object of the present invention to provide a semiconductor integrated circuit which allows MOSFET devices forming output parts thereof to be densely arranged, thereby reducing an overall size of the output parts.

In order to achieve the above objects according to the present invention, a semiconductor integrated circuit includes four electrodes arranged in a matrix, and a wire connecting between two electrodes which are diagonally positioned to each other and selected from said four electrodes, wherein the two remaining electrodes are diagonally positioned to each other across said wire, and have a side thereof facing said wire and extending in parallel to a longitudinal direction of said wire.

According to the semiconductor integrated circuit as described above, a shape of an electrode is different from a rectangular electrode used in the related-art configuration, which had a corner thereof closest to the wire and thus limiting how close the electrode can be to the wire. This corner of the rectangular electrode is beveled in the present invention, so that the electrode can be placed closer to the wire, thereby helping to reduce distances between the MOSFET devices.

According to another aspect of the present invention, a semiconductor integrated circuit includes four electrodes arranged in a matrix, and a wire connecting between two electrodes which are diagonally positioned to each other and selected from said four electrodes, wherein the two remaining electrodes are diagonally positioned to each other across said wire, and have a substantially circular shape.

According to the semiconductor integrated circuit described above, distances between the electrodes can be shortened to a minimum distance at any angle without making any slack, so that distances between MOSFET devices can be further reduced.

According to another aspect of the present invention, a semiconductor-device pattern includes four contact holes arranged in a matrix, four electrodes each corresponding to respective one of said four contact holes, each of said electrodes having a pattern area larger than that of a corresponding one of said contact holes so as to tolerate a margin of error in relative positioning of said electrodes and said contact holes, and a wire laid out in the same layer as said electrodes and connecting between two electrodes which are diagonally positioned to each other and selected from said four electrodes, wherein the two remaining electrodes are diagonally positioned to each other across said wire, and each of said two remaining electrodes have a point which is closest to said wire on a perimeter thereof, a shortest distance between the point and a corresponding contact hole is shorter than $\sqrt{2}$ times a shortest distance between the perimeter and the corresponding contact hole.

The configuration described above can reduce a gap between the electrodes and the wire compared to the related-art configuration. Namely, distances between the MOSFET devices can be reduced.

The same objects can also be achieved by a semiconductor device as described in the following.

According to one aspect of the present invention, a semiconductor device includes electrodes arranged in a matrix and wires connecting between electrodes and extending diagonally to columns and rows of the matrix, wherein one of said electrodes closest to and not connected to a given one of said wires has a side thereof facing the given one of said wires and extending in parallel to a longitudinal direction of the given one of said wires.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
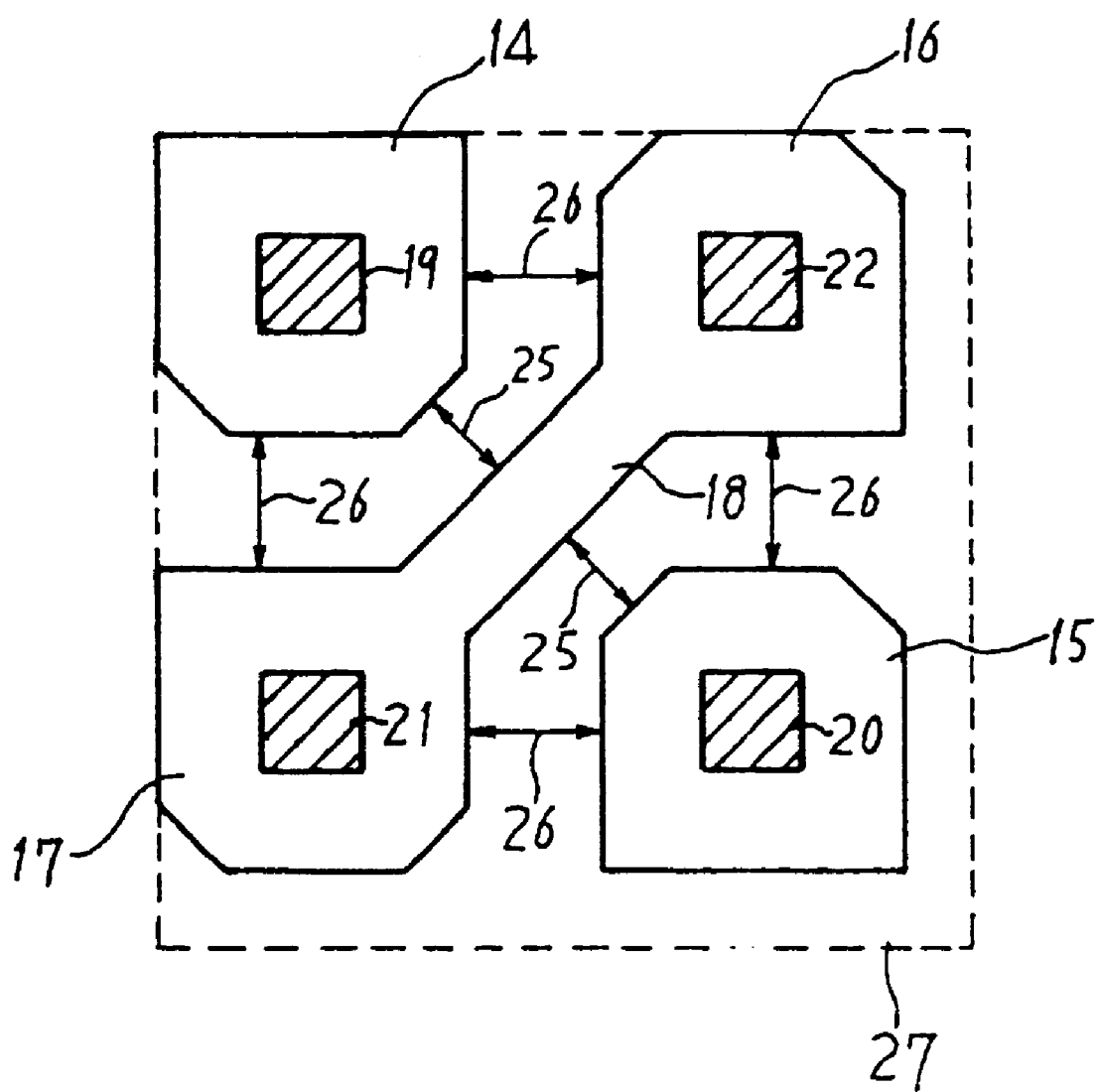
FIG. 1 is an illustrative drawing showing a configuration of a first embodiment of the present invention.
Figure 2:
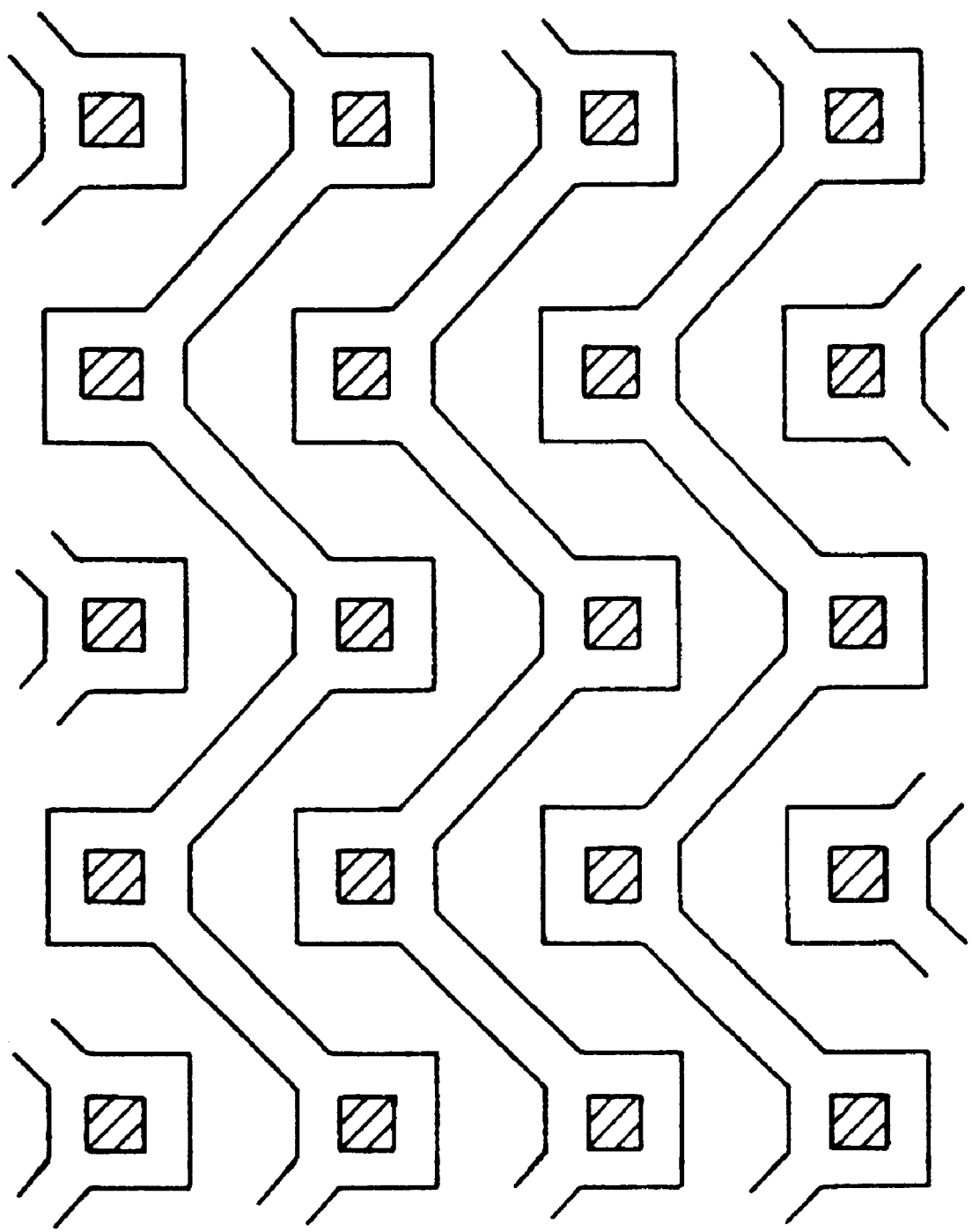
FIG. 2 is an illustrative drawing showing a configuration of output parts of a related-art power switch IC.
Figure 3:
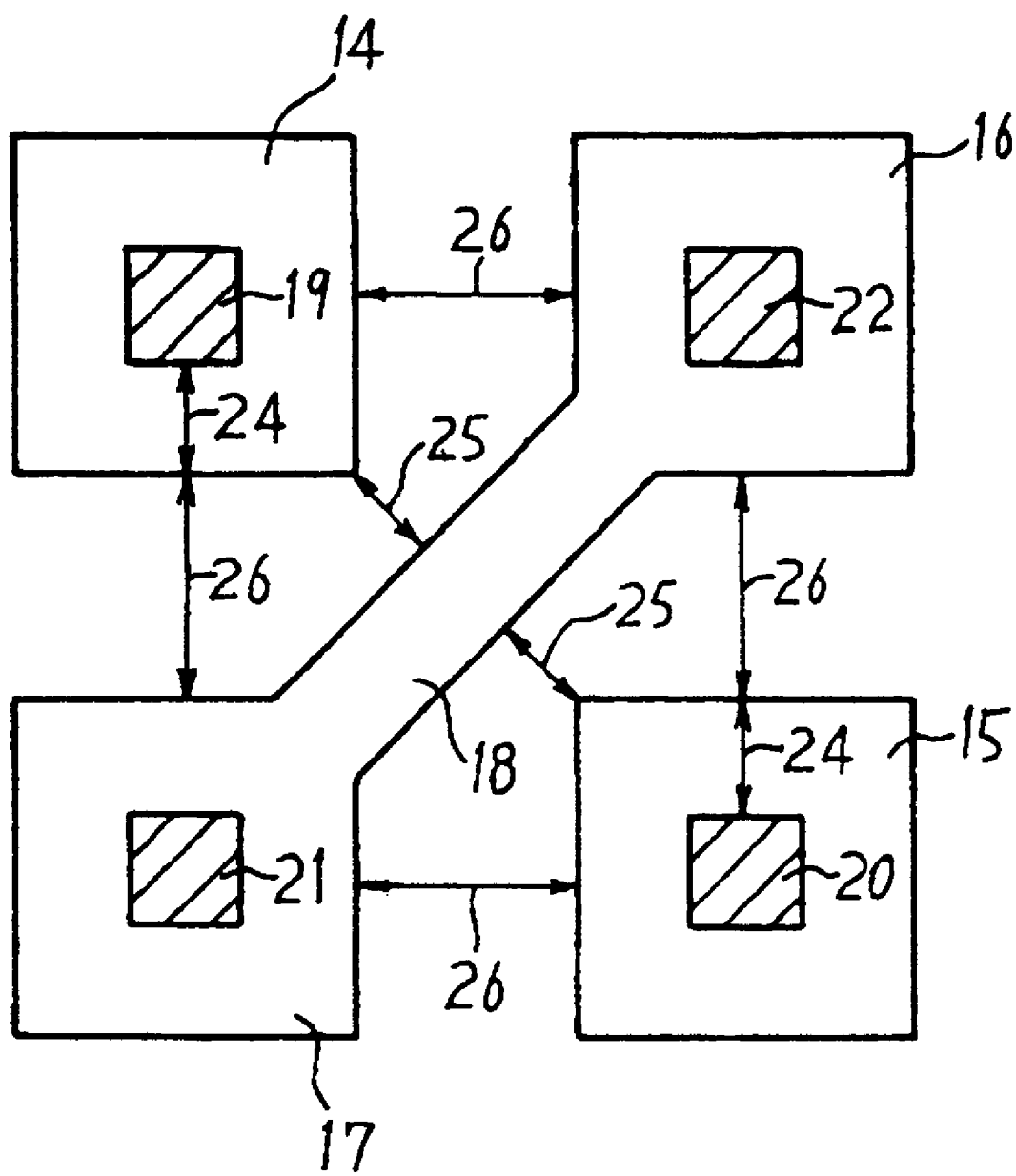
FIG. 3 is an illustrative drawing showing an enlarged view of MOSFET devices which are arranged as the output parts of the related-art power switch IC.

FIG. 1 is an illustrative drawing showing a configuration of a first embodiment of the present invention. FIG. 1 shows a plane view of MOSFET devices as a partial view of the output parts of a power switch IC according to the present invention. A pattern shown in FIG. 1 is spatially repeated to form the entire output parts. In FIG. 1, the same elements as those of FIG. 3 are referred to by the same numerals.

In FIG. 1, the source electrodes 14 and 15 have a side thereof facing the wire 18 and being parallel to the wire 18. This side gives an extra space between the source electrodes 14 and 15 and the wire 18, so that the distance 25 can remain longer than the minimum tolerable distance even if the distance 26 between the source electrodes 14 and 15 and the drain electrodes 16 and 17 is shortened to some extent. In the related-art configuration, a point which is closest to the wire 18 on the perimeter of the source electrodes 14 and 15 is farther away from the contact holes 19 and 20 than other points on the perimeter, and this distance is $\sqrt{2}$ times greater than the shortest distance between the perimeter of the source electrode and the contact hole. In this embodiment, however, this distance can be shortened. As a result, intervals between the MOSFET devices can be made shorter than in the related-art configuration, and a size of the pattern to be repeated becomes smaller than an area 27, which would be fully occupied by the MOSFET devices in the related-art configuration as a unit of spatial repetition. This leads to a reduction in the total area size of the output parts.

In this embodiment, the side of the electrodes facing the wire 18 is provided at an angle of 45°. It should be noted, however, that the present invention is not limited to this particular angle.

Figure 4:
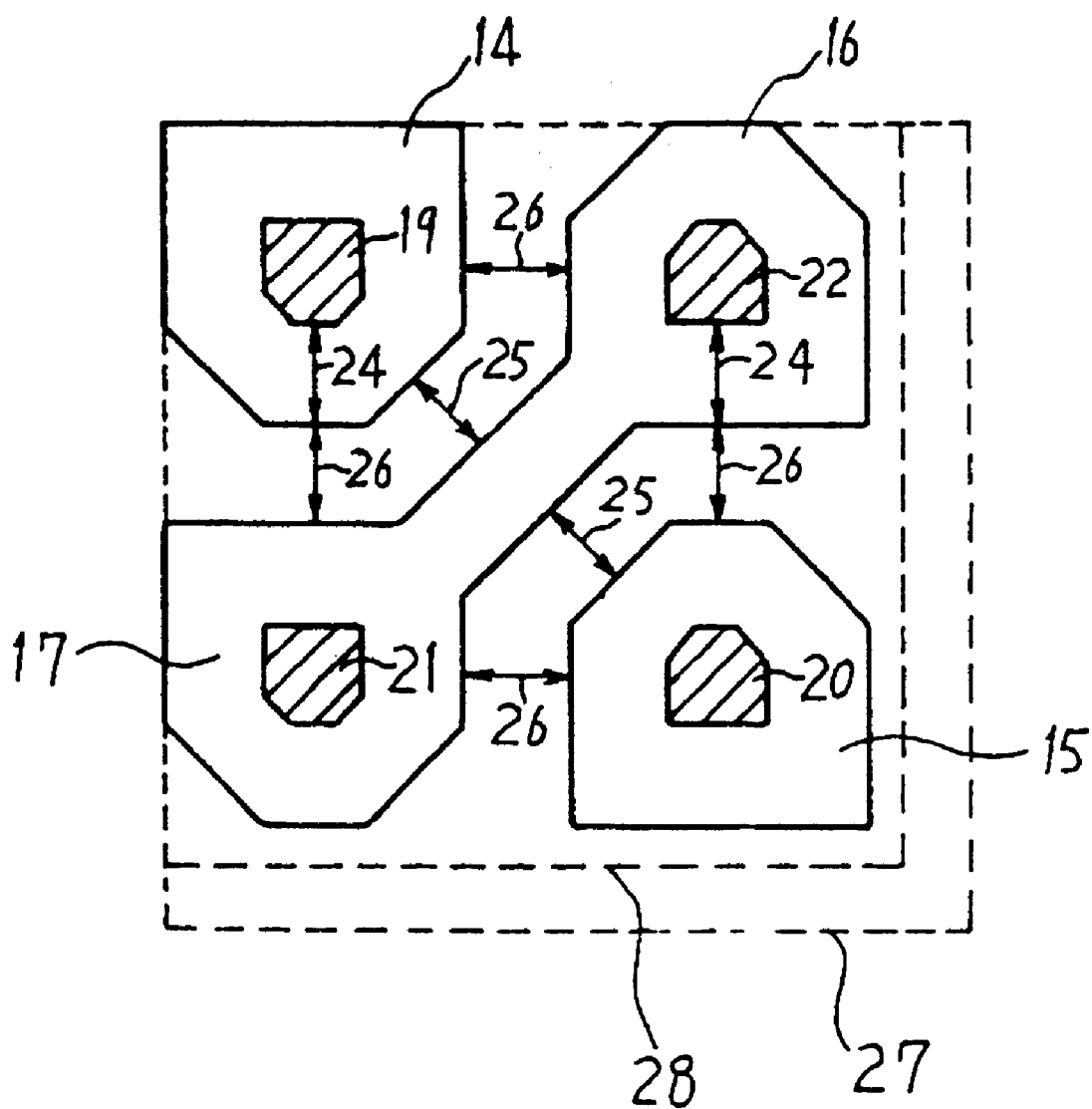
FIG. 4 is an illustrative drawing showing a configuration of a second embodiment of the present invention.

FIG. 4 is an illustrative drawing showing a configuration of a second embodiment of the present invention. As shown in FIG. 4, the contact holes 19 and 20 have corners thereof beveled in a similar fashion to the source electrodes 14 and 15. In FIG. 4, the same elements as those of FIG. 3 are referred to by the same numerals.

In FIG. 4, the contact holes 19 and 20 have a side thereof facing the wire 18 and being parallel to the wire 18. This side gives an extra space between the contact holes 19 and 20 and the outer edges of the source electrodes 14 and 15, so that the distance 25 can remain longer than the minimum tolerable distance even if the distance 26 between the source electrodes 14 and 15 and the drain electrodes 16 and 17 is shortened further than in the first embodiment. As a result, intervals between the MOSFET devices can be made shorter than in the related-art configuration, and a size of the pattern to be repeated becomes smaller than the area 27 of the related-art configuration and even smaller than an area 28 of the first embodiment. This leads to a further reduction in the total area size of the output parts.

In this embodiment, the contact holes 19 and 20 have the same shape as the source electrodes 14 and 15, so that the MOSFET devices can be arrayed as densely as possible without creating a wasted space. The side of the contact holes facing the wire 18 is provided at an angle of 45° in this embodiment. It should be noted, however, that the present invention is not limited to this particular angle.

Figure 5:
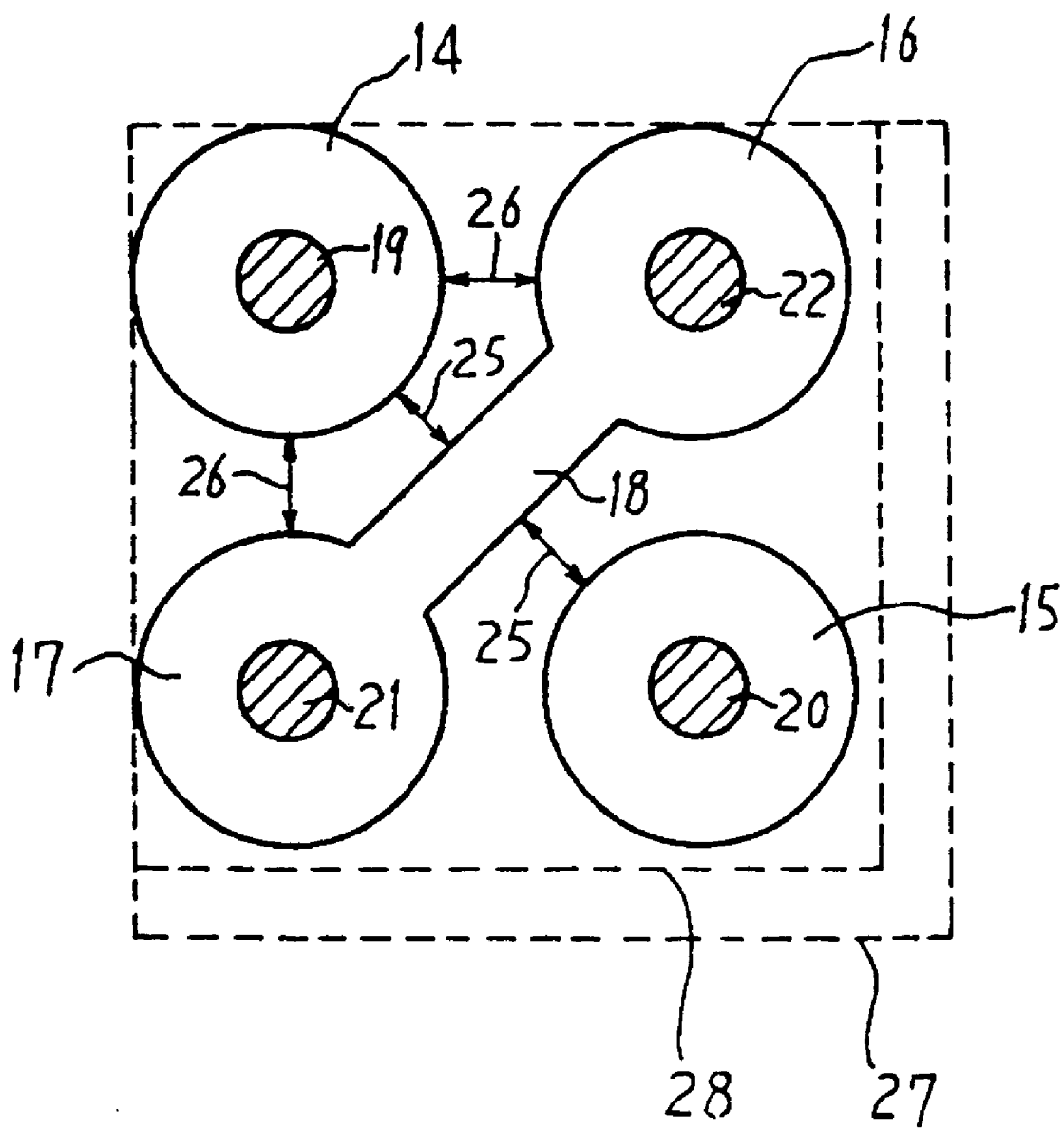
FIG. 5 is an illustrative drawing showing a configuration of a third embodiment of the present invention.

FIG. 5 is an illustrative drawing showing a configuration of a third embodiment of the present invention. As shown in FIG. 5, the source electrodes 14 and 15, the drain electrodes 16 and 17, and the contact holes 19 through 22 are fashioned in a circular shape. In FIG. 5, the same elements as those of FIG. 3 are referred to by the same numerals.

In FIG. 5, all of the source electrodes 14 and 15, the drain electrodes 16 and 17, and the contact holes 19 through 22 have a circular shape, so that distances between the respective regions do not include any excess. Since distances between the regions can be made the shortest at any angle in this configuration, a distance between the source electrodes 14 and 15 and the wire 18 can be inevitably set to the shortest, and so is a distance between the drain electrodes 16 and 17 and a corresponding wire. As a result, intervals between the MOSFET devices can be made shorter than in the related-art configuration, and a size of the pattern to be repeated becomes smaller than the area 27 of the related-art configuration and even smaller than the area 28 of the first embodiment. This leads to a further reduction in the total area size of the output parts.

In this embodiment, the shape of the electrodes and contact holes is described as a circular shape. It should be noted, however, that a polygon shape such as a octagon or hexagon shape may be used alternatively.

Figure 6:
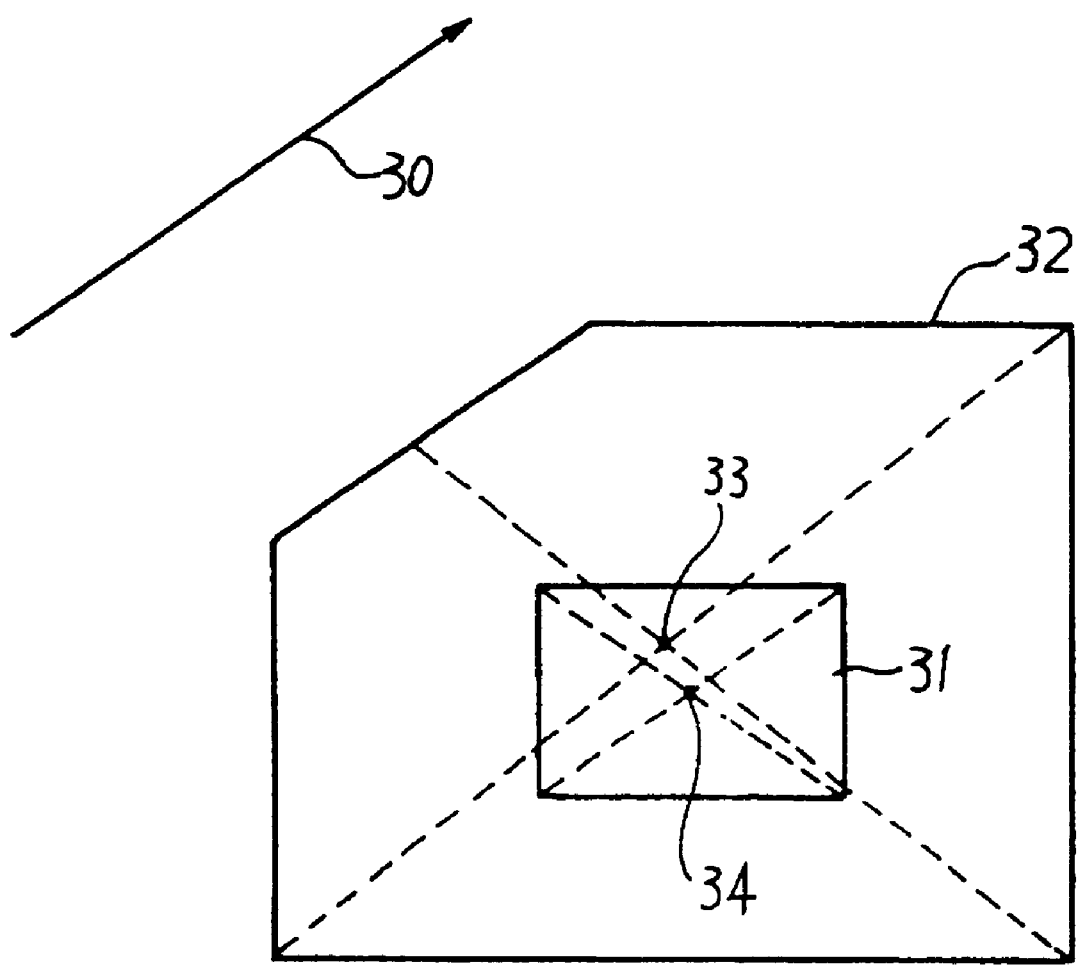
FIG. 6 is an illustrative drawing showing a configuration of a fourth embodiment of the present invention.

FIG. 6 is an illustrative drawing showing a configuration of a fourth embodiment of the present invention. FIG. 6 shows a situation in which a center of gravity of a contact hole does not coincide with a center of gravity of an electrode. A contact hole 31 does not have a side thereof extending in parallel to a direction 30 of a diagonally implemented wire, but has a center of gravity 34 which is deviated from a center of gravity 33 of an electrode 32 to keep more distance from the diagonally implemented wire. Displacing a center of gravity in this manner can help to further shorten the distances between the MOSFET devices.

Further, the present invention is not limited to these embodiments, but various variations and modifications may be made without departing from the scope of the present invention.

The present application is based on Japanese priority application No. 10-214970 filed on Jul. 30, 1998, with Japanese patent office, the entire contents of which are hereby incorporated by reference.

What is claimed is:

1. A semiconductor integrated circuit comprising:

four electrodes arranged in a matrix; and a wire connecting between two electrodes which are diagonally positioned to each other and selected from said four electrodes, wherein the two remaining electrodes are diagonally positioned to each other across said wire, and have a said thereof facing said wire and extending in parallel to a longitudinal direction of said wire, wherein the two electrodes connected by said wire are part of a single transistor, and are both drains or both sources.

2. The semiconductor integrated circuit as claimed in claim 1, further comprising contact holes each corresponding to a respective one of said four electrodes, wherein two of said contact holes corresponding to said two remaining electrodes have a side thereof facing said wire and extending in parallel to the longitudinal direction of said wire.

3. A semiconductor integrated circuit comprising:

four electrodes arranged in a matrix; and a wire connecting between two electrodes which are diagonally positioned to each other and selected from a said four electrodes, wherein the two remaining electrodes are diagonally positioned to each other across said wire, and have a substantially circular shape, wherein the two electrodes connected by said wire are part of a single transistor, and are both drains or both sources.

4. The semiconductor integrated circuit as claimed in claim 3, further comprising contact holes each corresponding to a respective one of said four electrodes, wherein two of said contact holes corresponding to said two remaining electrodes have a substantially circular shape.

5. A semiconductor-device pattern comprising:

four contact holes arranged in a matrix;

four electrodes each corresponding to respective one of said four contact holes, each of said electrodes having a pattern area larger than that of a corresponding one of said contact holes so as to tolerate a margin of error in relative positioning of said electrodes and said contact holes; and a wire laid out in the same layer as said electrodes and connecting between two electrodes which are diagonally positioned to each other and selected from said four electrodes, wherein the two remaining electrodes are diagonally positioned to each other across said wire, and each of said two remaining electrodes have a point which is closest to said wire on a perimeter thereof, a distance between the point and an edge of a corresponding contact hole being shortest among margins of the electrode around the corresponding contact hole, wherein the two electrodes connected by said wire are part of a single transistor, and are both drains or both sources.

6. The semiconductor-device pattern as claimed in claim 5, wherein each of said contact holes has the same shape as a corresponding one of said electrodes.

7. The semiconductor-device pattern as claimed in claim 5, wherein each contact hole corresponding to a respective one of said two remaining electrodes has a center of gravity positioned farther away from said wire than a center of gravity of the respective one of said two remaining electrodes.

8. A semiconductor device comprising:

electrodes arranged in a matrix; and wires connecting between electrodes and extending diagonally to columns and rows of the matrix, wherein one of said electrodes closest to and not connected to a given one of said wires has a side thereof facing the given one of said wires and extending in parallel to a longitudinal direction of the given one of said wires, wherein the two electrodes connected by said wire are part of a single transistor, and are both drains or both sources.

9. The semiconductor device as claimed in claim 8, further comprising contact holes each corresponding to a respective one of said electrodes, each of said contact holes having the same shape as that of a corresponding one of said electrodes.

* * * * *